United States Patent [19]

Neuhof et al.

[11] Patent Number: 5,662,397

[45] Date of Patent: Sep. 2, 1997

[54] OPERATING UNIT

[75] Inventors: Markus Neuhof, Ehringshausen; Wolfgang Reuter, Burbach, both of Germany

[73] Assignee: Rittal-Werk Rudolf Loh GmbH & Co. KG, Germany

[21] Appl. No.: 423,400

[22] Filed: Apr. 18, 1995

[30] Foreign Application Priority Data

Apr. 19, 1994 [DE] Germany ............................. 44 13 543.2

[51] Int. Cl.$^6$ ............................................. A47B 97/00

[52] U.S. Cl. ................... 312/223.1; 312/244; 312/265.5; 403/374; 403/409.1

[58] Field of Search ..................... 312/244, 263, 312/265.5, 265.6, 348.6, 223.1, 223.2, 223.6; 403/33, 17, 343, 374, 409.1; 206/305, 320; 220/732

[56] References Cited

U.S. PATENT DOCUMENTS

| | | | |
|---|---|---|---|
| 800,930 | 10/1905 | Maxwell | 312/265.5 X |
| 3,195,196 | 7/1965 | Carisi | 403/409.1 X |
| 3,574,367 | 4/1971 | Jankowski | 403/343 X |
| 4,123,129 | 10/1978 | Butler . | |
| 4,277,196 | 7/1981 | Morel | 403/409.1 X |
| 4,592,604 | 6/1986 | Wilke | 312/245 |

FOREIGN PATENT DOCUMENTS

| | | | |
|---|---|---|---|
| 507723 | 12/1951 | Belgium | 403/343 |
| 2691763 | 12/1993 | France | 403/374 |
| 2436439 | 12/1976 | Germany | 312/265.5 |
| 2917225 | 11/1980 | Germany . | |
| 4128355 | 6/1992 | Germany . | |
| 4111422 | 4/1995 | Germany . | |
| 571659 | 1/1976 | Switzerland | 403/343 |
| 351596 | 7/1931 | United Kingdom | 312/265.5 |
| 591338 | 8/1947 | United Kingdom | 312/263 |

OTHER PUBLICATIONS

German Rittal Catalog 27, dated 26 Jun. 1992, pp. 163–165.

*Primary Examiner*—James R. Brittain
*Assistant Examiner*—Hanh V. Tran
*Attorney, Agent, or Firm*—Speckman, Pauley & Fejer

[57] ABSTRACT

An operating unit with a housing for receiving an electrical or electronic circuit. The unit has vertical and horizontal lateral walls and a front wall. One or a plurality of laterally outwardly projecting handles for positioning the operating unit can be attached to the operating unit. The handle can be attached to the housing with little assembly effort and permits a user-friendly positioning of the housing. The handles can be profiled sections extending over at least a portion of the height or width of the lateral walls. The profiled sections are fastened on the housing in the area of the front edges formed by the front wall and the lateral wall. In the area of the front edges the profiled sections partially extend past the front wall and the lateral walls.

10 Claims, 3 Drawing Sheets ns 5,662,397

OPERATING UNIT

BACKGROUND OF THE INVENTION

1. Field of the Invention

This invention relates to an operating unit with a housing for receiving an electrical or electronic circuit and having vertical and horizontal lateral walls and a front wall. One or a plurality of laterally outwardly projecting handles for positioning the operating unit are attached.

2. Description of Prior Art

Such operating units are known from German Patent Publications DE 41 11 422 A1 and DE 41 28 355, for example. Such conventional operating units are employed as control units for machine tools, production lines, and the like. Such operating units are fastened on a support arm system or on a stand. Rotating and pivot hinges are provided for making individual adjustment positions of the operating unit possible for several users. The handles attached to the housing of the operating unit provide manipulation surfaces for the user to adjust the operating unit.

SUMMARY OF THE INVENTION

It is one object of this invention to provide an operating unit of the type mentioned above which can be positioned in a user-friendly manner by handles, and wherein such handles have relatively few parts and require a minimal assembly effort.

These and other objects of this invention are achieved with handles that form profiled sections that extend over at least a portion of the height or width of the lateral walls of the housing. The profiled sections are fastened on the housing in an area of front edges formed by the front wall and the lateral wall. In the area of front edges the profiled sections partially extend past the front wall and the lateral walls.

The profiled sections can be manufactured cost-effectively from relatively simple parts. For example, it is possible to cut desired lengths of profiled sections from a profiled bar. The profiled sections can extend either over only a part of the height or width of the lateral walls or over their entire height or width. Due to a choice of length of the profiled sections, the user is offered several gripping positions. The profiled sections can be screwed, for example, to the lateral walls or the front wall. According to one preferred embodiment of this invention, the profiled sections are a part of the housing. In such embodiment the front wall as well as the lateral walls are fixed in profiled sections. Thus, the profiled section can be a corner connector. An ergonomically advantageous gripping position is achieved in that the profiled sections partially extend past the front wall and the lateral walls in the area of the front edges. Thus, the user can introduce forces from various directions by the profiled sections into the operating housing.

In accordance with another preferred embodiment of this invention, a front panel with an opening is positioned on the front wall by fastening elements. The front panel has a plug-in shoulder which is inserted into a receiver of the profiled section. The profiled section can be placed in a predefined position by the plug-in shoulder. Thus, mounting of the profiled section is considerably simplified. The front panel is used, for example, as a support panel on which display devices and operating elements can be preassembled. Fixing the profiled section with respect to the housing can be achieved by a screw connection. According to another preferred embodiment of this invention, a plug-in shoulder of the front panel can be fixed with respect to the receiver of the profiled section by a clamping element which can be attached to the profiled section. Thus, the profiled section can be fixed with respect to the housing because of the clamping effect provided by the clamping element.

In such preferred embodiment the profiled section has a longitudinally-oriented screw receiver into which a screw, which serves as a clamping element, can be screwed. The receiver of the profiled section is compressed because of the threaded movement of the screw into the profiled section, so that the plug-in shoulder of the front panel becomes clamped in the receiver.

Connecting the lateral walls to the front wall, or connecting the front panel to the front wall can be achieved with screw connections, for example. In accordance with one preferred embodiment of this invention, the profiled section covers the screw heads that project from the housing, and thus improves the aesthetics of the housing.

According to another preferred embodiment of this invention, the profiled section has a gripping surface which has a three-quarter circle cross section. Such a profiled section can be easily gripped by hand. If the gripping surface is supported on the front panel or on the front wall by a support bar, a flush transition from the profiled section to the front panel or the front wall is created. The potential for injury is lowered with such a profiled section. With conventional units, a hand grips a handle which is distanced from the lateral wall. If the operating unit is rotated too far, there is a danger that the fingers of the user will be pinched. This danger does not exist with the profiled section in accordance with this invention. If the operating unit is rotated too far, the hand merely slides off the profiled section. The fingers cannot be pinched between the profiled section and the front wall or the lateral wall.

The assembly of an operating unit can be considerably reduced if the profiled section is formed in one piece on the front wall or on the lateral wall. Thus, the step of attaching the handles is eliminated. However, the profiled sections can be separate parts, for example an extruded profiled section. To improve the aesthetics of the profiled sections, covers can be placed on the front of the profiled sections.

BRIEF DESCRIPTION OF THE DRAWINGS

This invention will be described in detail below in conjunction with the drawings, wherein.

DESCRIPTION OF PREFERRED EMBODIMENTS

Figure 1:
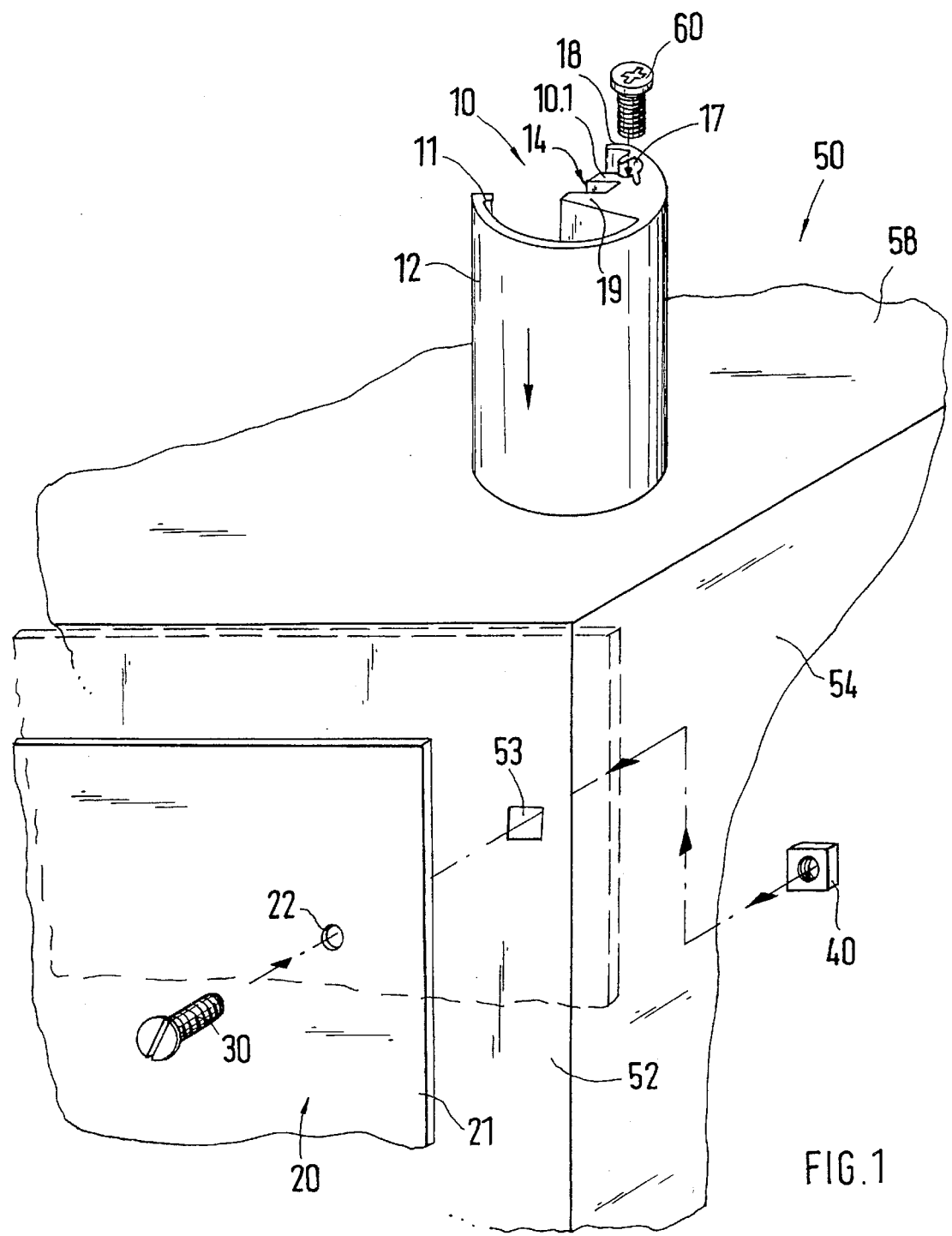
FIG. 1 shows an exploded perspective view of a housing with a front panel and a profiled section formed as a handle, according to one preferred embodiment of this invention.

A housing 50 is shown in a partial view in FIG. 1. The housing 50 has vertical lateral walls 54 and horizontal lateral walls 58. The front of the housing 50 is closed off with a front wall 52. The front wall 52 has fastening receivers 53 which are preferably square holes. In one preferred embodiment of this invention, panel 52 forms an opening 51. A nut 40 can be disposed behind the fastening receiver 53 from the back of the front wall 52. The nut 40 is held in a frame which is positioned in the fastening receiver 53 by arresting elements. A front panel 20 is placed on the front of the front wall 52. The front panel 20 has screw receivers 22 which can be arranged to be in communication with the fastening receivers 53 of the front wall 52.

The front panel 20 can be fixed on the front wall 52 by fastening screws 30. A fastening screw 30 can be inserted through the screw receiver 22 and the fastening receiver 53 and can engage the nut 40. A handle formed as a profiled section 10 can be attached to the housing 50. The profiled section 10 has a gripping surface 12 which has a cross section in the general shape of three-quarters of a circle. The gripping surface 12 makes a transition into a support bar 11 at one end.

The gripping surface 12 has a shoulder 18 on another end. Two legs 10.1, 19 protrude inward from the gripping surface 12. A longitudinally oriented screw receiver 17 has been cut into the leg 10.1. A longitudinally oriented receiver 14 is formed between the two legs 10.1, 19. A screw 60 can be screwed into the screw receiver 17 and serve as a clamping element. The profiled section 10 with the receiver 17 can be urged onto a plug-in shoulder 21 of the front panel 20. The front panel 20 projects laterally past the lateral wall 54. When the profiled section 10 is urged onto the plug-in shoulder 21, the support bar 11 of the gripping surface 12 laterally projects over the screw head of the fastening screw 30. This is shown in greater detail in FIG. 2.

Figure 2:
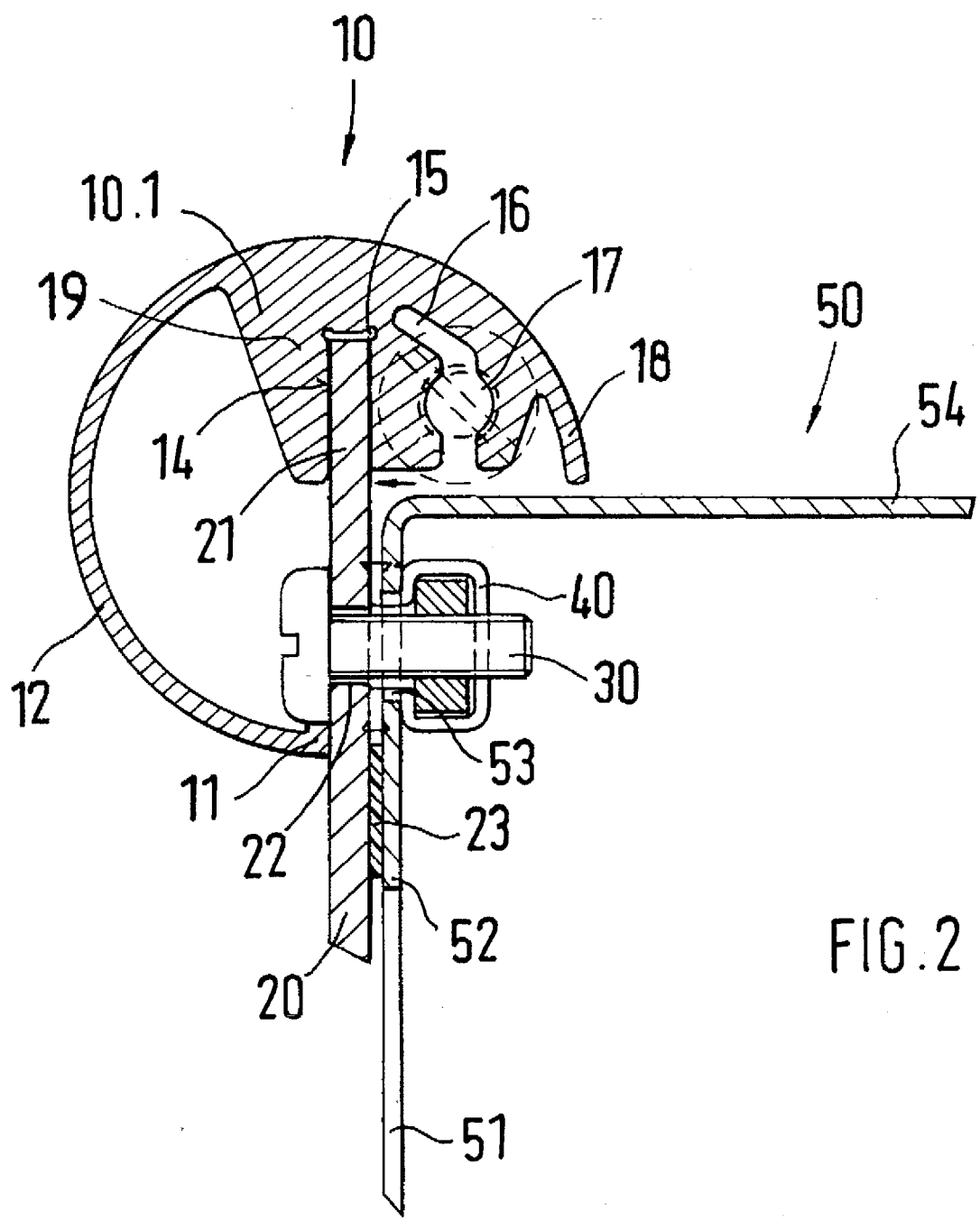
FIG. 2 shows a top partial cross-sectional view of the profiled section shown in FIG. 1 in an installed position on the housing.

The profiled section 10 installed on the housing 50 is shown in a partial cross-sectional top view in FIG. 2. The profiled section 10 can be displaced only in a linear direction because of the placement of the support bar 11 and the receiver 14. The receiver 14, which encloses the plug-in shoulder 21, prevents profiled section 10 from moving perpendicularly with respect to the front wall 52. A perpendicular movement with respect to the lateral wall 54 is prevented by the support bar 11. One surface of the support bar 11 is supported on the front panel 20, and another surface of the support bar 11 is supported on the screw head of the fastening screw 30. Fixing the profiled section 10 in a linear direction with respect to the plug-in shoulder 21 is achieved by the clamping element 60 shown in FIG. 1., which is screwed into the screw receiver 17. The leg 10.1 is moved in a direction toward the receiver 14. The plug-in shoulder 21 of the front panel 20 is clamped in the receiver 14 of the profiled section 10 because of the resilient bending of the leg 10.1. To allow the displacement of the leg 10.1 in the direction toward the receiver 14 with a relatively low amount of force, the leg 10.1 is connected to the gripping surface 12 by a bar which is weakened in cross section. The bar is weakened by a groove 15, and a linear slit 16 that extends from the screw receiver 17.

To prevent moisture and dirt from penetrating into the interior of the housing 50, a seal 23 has been positioned between the front panel 20 and the front wall 52.

The profiled section 10 shown in FIGS. 1 and 2 projects beyond the front-wall 52 and the lateral wall 54 in the area of the front edges formed by the lateral wall 54 and the front wall 52. Thus, the profiled section 10 extends only over a portion of the vertical lateral wall 54. According to another preferred embodiment of this invention, a plurality of small profiled sections 10 can be fastened above each other on the front panel 20 or, as shown in FIG. 4, one profiled section 10 can extend over the entire height of the lateral wall 54.

Figure 4:
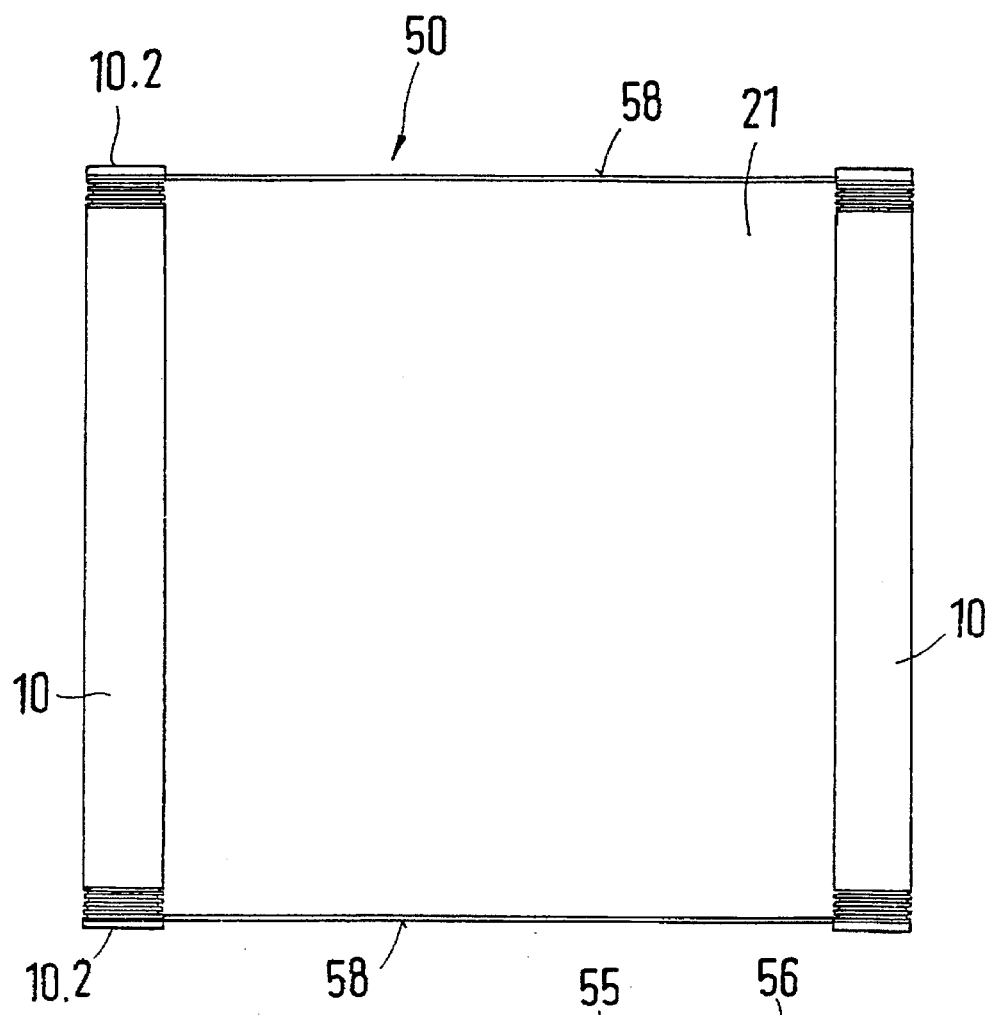
FIG. 4 shows a front view of an operating unit with two profiled sections, according to another preferred embodiment of this invention.

As shown in FIG. 4, the profiled sections 10 can be closed off by caps 10.2. A door 55 can be hinged on the back of the housing 50. Items positioned in the interior of the housing 50 are accessible through the door 55. The door 55 can be secured by a lock 56.

According to another preferred embodiment of this invention, an opening 57 has been cut into the upper horizontal lateral wall 58. Cables, which are brought in from a support arm, can be guided into the interior of the housing through the opening 57. The support arm, not shown in FIG. 3, can be flanged to the housing 50 by fastening receivers 59 arranged about the opening 57.

Figure 3:
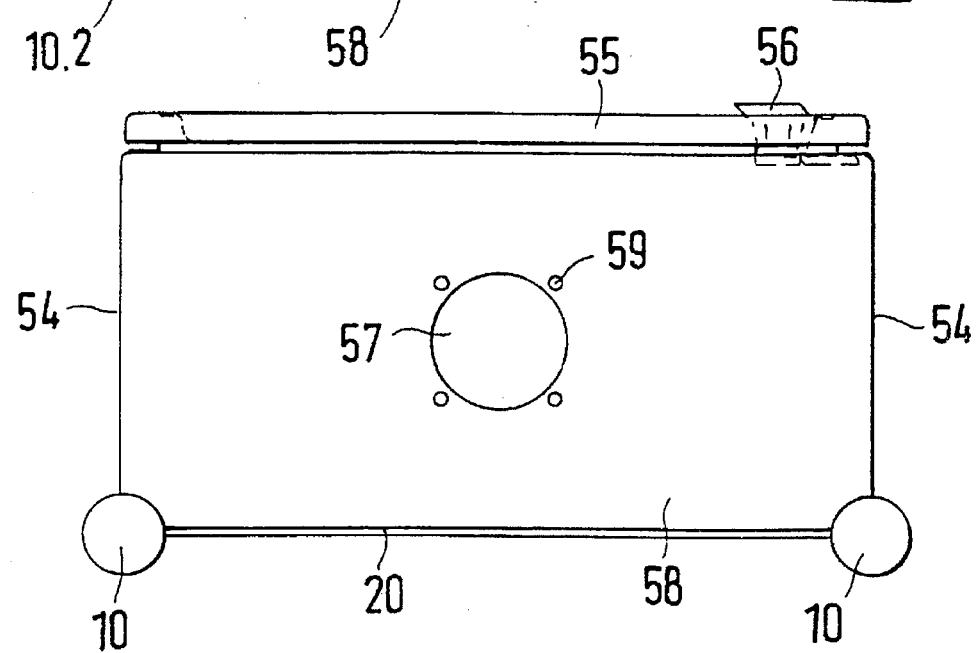
FIG. 3 shows a top view of an operating unit with two profiled sections.

According to one preferred embodiment of this invention, the profiled section 10 is positioned on two oppositely located lateral walls 54, 58, as shown in FIG. 3. According to another preferred embodiment of this invention, a continuous ring of profiled sections 10 are positioned on all four lateral walls 54, 58. According to yet another preferred embodiment of this invention, only one profiled section 10 is positioned on the housing 50, and can be used, for example, as a handle.

We claim:

1. An operating unit with a housing for receiving an electrical or electronic circuit, wherein the operating unit has a plurality of vertical lateral walls and at least one horizontal lateral wall and a front wall, at least one laterally outwardly projecting handle for positioning the operating unit is fixed with respect to said operating unit, the at least one handle forming at least one profiled section (10) and extending over at least a portion of one of the height and width of at least one of the vertical lateral walls (54), the at least one profiled section (10) being secured on the housing (50) in an area of at least one front edge formed by the front wall (52) and at least one of the vertical lateral walls (54), a portion of the at least one profiled section (10) extending past the front wall (52) and at least one of the vertical lateral walls (54) in the area of the at least one front edge, the improvement comprising:

at least one front panel (20) positioned on the front wall (52), at least one fastening element (30) fixing the at least one front panel (20) with respect to the from wall (52), the at least one from panel (20) having a shoulder (21) extending parallel to the from wall (52) beyond an outside surface of an adjacent one of the vertical lateral walls (54), the at least one profiled section (10) having a receiver (14), the shoulder (21) positioned within the receiver (14); and a clamping element (60) fixing the shoulder (21) with respect to the receiver (14), and the clamping element (60) secured in the at least one profiled section (10).

2. An operating unit in accordance with claim 1, wherein the at least one profiled section (10) has a longitudinal screw receiver (17), the clamping element (60) comprises a screw, the screw threadedly engages the longitudinal screw receiver (17), and the receiver (14) is compressed by the screw-in movement of the screw, so that the shoulder (21) is fixed with respect to the receiver (14).

3. An operating-unit in accordance with claim 2, wherein at least a portion of the at least one fastening element (30) is positioned in the at least one profiled section (10).

4. An operating unit in accordance with claim 3, wherein the at least one profiled section (10) further comprises a gripping surface (12), a cross section of the gripping surface (12) has an overall shape of a three-quarter circle, and a support bar (11) of the at least one profiled section (10) is positioned on one of the at least one front panel (20) and the front wall (52).

5. An operating unit in accordance with claim 4, wherein the at least one profiled section (10) comprises an extruded profiled section.

6. An operating unit in accordance with claim 5, wherein at least one cover (10.2) is positioned on an end portion of the at least one profiled section (10).

7. An operating unit in accordance with claim 1, wherein at least a portion of the at least one fastening element (30) is positioned in the at least one profiled section (10).

8. An operating unit in accordance with claim 1, wherein the at least one profiled section (10) further comprises a gripping surface (12), a cross section of the gripping surface (12) has an overall shape of a three-quarter circle, and a support bar (11) of the at least one profiled section (10) is positioned on one of the at least one front panel (20) and the front wall (52).

9. An operating unit in accordance with claim 1, wherein the at least one profiled section (10) comprises an extruded profiled section.

10. An operating unit in accordance with claim 1, wherein at least one cover (10.2) is positioned on an end portion of the at least one profiled section (10).

* * * * *